(12) United States Patent
Yeung et al.

(10) Patent No.: US 10,529,644 B2
(45) Date of Patent: Jan. 7, 2020

(54) SEMICONDUCTOR DEVICE

(71) Applicant: Nexperia B.V., Nijmegen (NL)

(72) Inventors: Shun Tik Yeung, Hong Kong (HK);
Pompeo Umali, Kwai Chung (HK);
Hans-Juergen Funke, Luebeck (DE);
Chi Ho Leung, Kwun Tong (HK);
Wolfgang Schnitt, Hamburg (DE);
Zhihao Pan, Hamburg (DE)

(73) Assignee: Nexperia B.V., Nijmegen (NL)

(*) Notice: Subject to any disclaimer, the term of this patent is extended or adjusted under 35 U.S.C. 154(b) by 0 days.

(21) Appl. No.: 15/049,419

(22) Filed: Feb. 22, 2016

(65) Prior Publication Data
US 2016/0260651 A1 Sep. 8, 2016

(30) Foreign Application Priority Data
Mar. 6, 2015 (EP) ..................... 15157936

(51) Int. Cl.
*H01L 23/10* (2006.01)
*H01L 23/34* (2006.01)
(Continued)

(52) U.S. Cl.
CPC .......... *H01L 23/3675* (2013.01); *H01L 21/78* (2013.01); *H01L 23/4334* (2013.01);
(Continued)

(58) Field of Classification Search
CPC ... H01L 23/367; H01L 23/3675; H01L 23/40; H01L 23/42; H01L 23/4334; H01L 23/492; H01L 21/78; H01L 24/97
(Continued)

(56) References Cited

U.S. PATENT DOCUMENTS 3,972,062 A * 7/1976 Hopp ..................... H01L 23/36
257/778
6,262,489 B1 7/2001 Koors et al.
(Continued)

FOREIGN PATENT DOCUMENTS

DE 102005004160 A1 8/2006
EP 2421032 A1 2/2012
(Continued)

OTHER PUBLICATIONS

EP Search Report, dated Jul. 8, 2015, for European Application No. 15157936.4, 9 pages.
(Continued)

*Primary Examiner* — Mohammed Shamsuzzaman
*Assistant Examiner* — Aaron J Gray
(74) *Attorney, Agent, or Firm* — Ohlandt, Greeley, Ruggiero & Perle, L.L.P.

(57) ABSTRACT

A semiconductor device and a method of making the same. The device includes an electrically conductive heat sink having a first surface. The device also includes a semiconductor substrate. The device further includes a first contact located on a first surface of the substrate. The device also includes a second contact located on a second surface of the substrate. The first surface of the substrate is mounted on the first surface of the heat sink for electrical and thermal conduction between the heat sink and the substrate via the first contact. The second surface of the substrate is mountable on a surface of a carrier.

15 Claims, 7 Drawing Sheets

(51) Int. Cl.
*H01L 23/495* (2006.01)
*H01L 23/367* (2006.01)
*H01L 27/02* (2006.01)
*H01L 21/78* (2006.01)
*H01L 23/00* (2006.01)
*H01L 25/075* (2006.01)
*H01L 23/433* (2006.01)
*H01L 23/492* (2006.01)
*H01L 33/00* (2010.01)
*H01L 33/64* (2010.01)
*H01L 23/31* (2006.01)

(52) U.S. Cl.
CPC ............ *H01L 23/492* (2013.01); *H01L 24/37* (2013.01); *H01L 24/92* (2013.01); *H01L 24/97* (2013.01); *H01L 25/0753* (2013.01); *H01L 27/0255* (2013.01); H01L 23/3107 (2013.01); H01L 24/29 (2013.01); H01L 24/32 (2013.01); H01L 24/73 (2013.01); H01L 24/83 (2013.01); H01L 33/0075 (2013.01); H01L 33/647 (2013.01); H01L 2224/2929 (2013.01); H01L 2224/29101 (2013.01); H01L 2224/37147 (2013.01); H01L 2224/48091 (2013.01); H01L 2224/48247 (2013.01); H01L 2224/48465 (2013.01); H01L 2224/73265 (2013.01); H01L 2224/8385 (2013.01); H01L 2224/83192 (2013.01); H01L 2224/83455 (2013.01); H01L 2224/83801 (2013.01); H01L 2224/8485 (2013.01); H01L 2224/84801 (2013.01); H01L 2224/922 (2013.01); H01L 2924/00014 (2013.01); H01L 2924/0781 (2013.01); H01L 2924/12036 (2013.01); H01L 2924/13091 (2013.01)

(58) Field of Classification Search
USPC ......... 257/706, 707, 720, 666; 438/122, 123
See application file for complete search history.

(56) References Cited

U.S. PATENT DOCUMENTS

| | | | |
|---|---|---|---|
| 6,677,669 B2 * | 1/2004 | Standing | H01L 23/047 174/541 |
| 7,166,496 B1 | 1/2007 | Lopez et al. | |
| 8,531,016 B2 | 9/2013 | Cho | |
| 2001/0048116 A1 | 12/2001 | Standing et al. | |
| 2002/0008319 A1 | 1/2002 | Davis et al. | |
| 2003/0016505 A1 | 1/2003 | Jauregui | |
| 2003/0075786 A1 | 4/2003 | Joshi et al. | |
| 2003/0122247 A1 | 7/2003 | Joshi | |
| 2004/0061221 A1 * | 4/2004 | Schaffer | H01L 24/40 257/723 |
| 2004/0159939 A1 | 8/2004 | Joshi | |
| 2004/0183196 A1 | 9/2004 | Yang et al. | |
| 2004/0266037 A1 | 12/2004 | Knapp et al. | |
| 2005/0029666 A1 | 2/2005 | Kurihara et al. | |
| 2006/0060891 A1 | 3/2006 | Pavier et al. | |
| 2006/0175700 A1 * | 8/2006 | Kagii | H01L 21/52 257/706 |
| 2006/0197187 A1 | 9/2006 | Lohninger et al. | |
| 2007/0138651 A1 * | 6/2007 | Hauenstein | H01L 23/13 257/782 |
| 2007/0278550 A1 | 12/2007 | Asai et al. | |
| 2008/0048342 A1 * | 2/2008 | Cheah | H01L 23/49524 257/777 |
| 2008/0296760 A1 | 12/2008 | Nogi et al. | |
| 2009/0127677 A1 * | 5/2009 | Gomez | H01L 23/4093 257/666 |
| 2009/0194856 A1 | 8/2009 | Gomez | |
| 2009/0230535 A1 * | 9/2009 | Otremba | H01L 21/561 257/690 |
| 2010/0044885 A1 | 2/2010 | Fuergut et al. | |
| 2010/0127365 A1 | 5/2010 | Galera et al. | |
| 2010/0133666 A1 | 6/2010 | Meyer-Berg et al. | |
| 2010/0308454 A1 | 12/2010 | Lu | |
| 2011/0101511 A1 | 5/2011 | Lu et al. | |
| 2012/0286410 A1 | 11/2012 | Groenhuis et al. | |
| 2013/0320551 A1 | 12/2013 | Boettcher et al. | |
| 2013/0334695 A1 * | 12/2013 | Tijssen | H01L 23/48 257/773 |

FOREIGN PATENT DOCUMENTS

| | | |
|---|---|---|
| EP | 2667540 A1 | 12/2013 |
| JP | 2001203301 A | 7/2001 |
| JP | 2005051267 A | 2/2005 |
| JP | 3730469 B2 | 1/2006 |

OTHER PUBLICATIONS

Extended European Search Report for Patent Ap No. 10191081.8, dated May 12, 2011.

* cited by examiner

SEMICONDUCTOR DEVICE

CROSS-REFERENCE TO RELATED APPLICATIONS

This application claims priority under 35 U.S.C § 119 to European patent application no. EP15157936.4, filed Mar. 6, 2015, the contents of which are incorporated by reference herein.

FIELD OF THE INVENTION

This invention relates to a semiconductor device.

BACKGROUND OF THE INVENTION

Quad Flat No-leads (QFN) packages are commonly used for discrete devices due to the small footprint and the small package height.

An example of a semiconductor device 200 comprising a QFN package is shown in FIG. 1. The device 200 includes a lead frame 210 upon which is mounted a semiconductor substrate 202. A contact 206 on a surface of the substrate 202 allows an electrical connection to be formed with a first part of the lead frame 210 (e.g. by soldering). Another contact 204 is located on a surface of the substrate 202 opposite the surface on which the contact 206 is located. The contact 204 is electrically connected to another part of the lead frame using bond wire 250. The device 200 also includes an encapsulant 240 for protecting the features of the substrate 202 and lead frame 210. Parts 212 and 214 of the lead frame 210 are exposed at one side of the package 200 (i.e. they are not covered by the encapsulant 240). These parts 212 and 214 of the lead frame 210 provide external electrical connections for the device 200. For instance, the parts 212 and 214 of the lead frame 210 can be mounted on a carrier such as a printed circuit board (e.g. by soldering).

QFN packages have rather low heat capacity and heat conductivity, which can make then unsuitable for devices that dissipate a lot of power (such as like transient voltage suppression (TVS) protection devices). QFN packages can also add to the on-resistance of the device due to the bond wire that is used. Moreover, the thickness of QFN packages cannot be reduced significantly because lead-frame thickness, die thickness and bond wire loop height all add to the total thickness.

Devices such as transient voltage suppression (TVS) protection devices are used for protecting integrated circuits (ICs) against electrical overstress. In use, these devices are connected between an external input and the input of an IC, and can operate to drain unwanted, oftentimes large, currents to ground or another rail so that any internally provided protection of the IC is not overstressed and damaged.

The heat caused by the current within the protection device can limit the robustness of the device. The temperature within the protection device is dependent on factors such as the dissipated power, the thermal capacity of the device and the thermal resistance of the device.

TVS protection devices may include semiconductor diodes. In such a device, a pn junction may be provided near a first surface of a semiconductor substrate. In such devices, the main part of the heat created by the stress current occurs at the pn junction. On the other hand, the surface of the substrate is usually the part of the substrate that is most sensitive to heat (due to the presence of a metal contact on the surface, which can melt if the temperature in the device is too great). A second contact of the diode is usually provided on a second of the substrate. In such devices, heat diffusion from the pn junction to cooler parts of the device is highly asymmetrical because the pn junction is located near one of the surfaces of the substrate.

One kind of package for a semiconductor device involves the use of a clip bond. The clip replaces the bond wire in FIG. 1. The bottom of the substrate is soldered or glued to a lead frame finger, and a metal clip is soldered or glued to the top contact of the substrate and to a second lead frame finger. The two lead frame fingers serve as electrical contacts that can be soldered to a carrier such as a printed circuit board (PCB). However, a device using this approach may suffer from limitations associated with heat caused by stress pulses. For instance, the limited thickness of the clip limits its thermal capacity of the clip. The multiple solder or glue points can also limit thermal conduction away from the substrate. Lead frame materials are also not optimized for thermal resistance.

In another kind of package, known as the chip scale package, two contacts may be located on a common surface of the substrate. The substrate can be soldered top-down onto a carrier such as a PCB. The connections between the substrate and the carrier have limited thermal capacity. A further major disadvantage of the CSP is that current flow within the substrate flows in a lateral direction (between the two contacts on the top side). This can lead to current crowding and local heating, which can strongly reduce the robustness of the device.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a semiconductor device. The device includes an electrically conductive heat sink having a first surface. The device also includes a semiconductor substrate. The device further includes a first contact located on a first surface of the substrate. The device also includes a second contact located on a second surface of the substrate. The first surface of the substrate is mounted on the first surface of the heat sink for electrical and thermal conduction between the heat sink and the substrate via the first contact. The second surface of the substrate is mountable on a surface of a carrier.

The provision of an electrically conductive heat sink, upon a first surface of which the first surface of the substrate is mounted for electrical and thermal conduction, may improve heat dissipation within the device compared to known devices. This may allow the device to handle larger currents, for instance during stress pulses associated with spikes in the current passing through the device. Also, since the heat sink is electrically conductive, it may allow an electrical connection to the first contact to be made. The dual function of the heat sink may allow a compact package to be provided.

The carrier may, for instance, be a printed circuit board (PCB). The second surface of the substrate and the electrically conductive heat sink may both be mountable on the surface of the carrier. This can allow for secure mounting of the device on the carrier, and in some embodiments can also allow the heat sink to form an electrical connection between the surface of the carrier and the first contact of the substrate and the carrier.

In one embodiment, the electrically conductive heat sink may include a first portion that extends substantially parallel to a plane containing the first surface of the substrate, wherein the first portion comprises said first surface of the electrically conductive heat sink. The first portion of the electrically conductive heat sink may thus provide a secure platform for receiving the semiconductor substrate. In some examples, first portion may be dimensioned so as to receive more than one substrate of the kind described herein.

The heat sink may also include a second portion that extends away from the first portion for mounting the electrically conductive heat sink on the surface of the carrier. In some examples, the second portion may extend in a direction substantially perpendicular to the plane parallel to which the first portion extends. The second portion may include one or more contacts for electrically connecting the heat sink to one or more corresponding contacts on the surface of the carrier. As noted above, the electrically conductive heat sink may in some embodiments provide for an electrical connection between the surface of the carrier and the first contact of the substrate and the carrier. In some embodiments, the heat sink may include one or more further portions such as the second portion, to allow mounting and/or electrical connection of the heat sink at multiple locations on the surface of the carrier.

In some embodiments, the semiconductor device may include at least one further semiconductor substrate. The or each semiconductor substrate may include a pn-junction diode. Where multiple substrates are provided, the component (such as a pn-junction diode) provided within each semiconductor substrate may be electrically connected in parallel with the component(s) provided within the other substrate(s) for increasing the capacity of the device. Alternatively, the components may be connected in series so as to provide a bidirectional device. Alternatively, the components may be independent and may be connected to different contacts, such creating a multi-pin device, the final schematic defined by the connections on the carrier.

In one embodiment, the device may include a second semiconductor substrate that includes a first contact located on a first surface of the second substrate, and a second contact located on a second surface of the second substrate. The first surface of the second substrate may be mounted on the first surface of the heat sink for electrical and thermal conduction between the heat sink and the substrate via the first contact. The second surface of the second substrate may be mountable on the surface of the carrier. The heat sink may electrically interconnect the first contact of each semiconductor substrate, for current flow between the substrates. The heat sink in embodiments of this kind may be left electrically floating in the sense that it is not connected to an external voltage such as ground. In one such example, the components (e.g. pn-junction diodes) within each semiconductor substrate may be connected in series so as to provide a bidirectional device as noted above.

The electrically conductive heat sink may be coated with an electrically conductive layer. The electrically conductive layer may be NiPdAu. This layer can act as a wetting layer to improve the solderability of the surface of the heat sink.

The electrically conductive heat sink may be metallic. For instance, the electrically conductive heat sink may comprise copper.

In some embodiments, an encapsulant can cover the or each semiconductor substrate while leaving the second contact of the or each substrate exposed. The encapsulant may provide protection for the substrate(s) (for example, for the edges of the substrate(s)), while allowing electrical connections to be made to the device using the second contact of the or each substrate. In one embodiment, the device comprises a chip scale package including the heat sink, one or more substrates and the encapsulant.

In some embodiments, solder or an electrically conductive glue may be used to attach the first contact of the or each substrate to the first surface of the heat sink.

In some embodiments, the device may be mounted on the surface of the carrier.

In some embodiments, the substrate may include an active region located adjacent one of the surfaces of the substrate. In general, the active region can be a region of the substrate containing active components of the device, such as a pn junction (where device comprises a diode) or the channel of a transistor (e.g. MOS transistor). In use, the active region of the substrate may be more susceptible to heating, particularly during stress pulses. For purposes of this disclosure, the term "active surface" may be used to refer to the surface of the substrate which is closest to the active region of the substrate. For purposes of this disclosure, the surface of the substrate opposite active surface may be referred to the "passive surface". The active and passive surfaces may, for example, be a major surface and a backside of the substrate, respectively.

In some embodiments, the first surface is an active surface of the substrate, while the second surface is a passive surface of the substrate. Accordingly, the active surface of the substrate may be mounted on the first surface of the heat sink. In this way, the region of the substrate that is more susceptible to heating may be placed closest to the heat sink, which may enhance the ability of the heat sink to protect the device against overheating, particularly during stress pulses.

In some embodiments, the device may be a transient voltage suppression (TVS) diode. Problems relating to heat dissipation are known to limit the operation of known kinds of TVS diodes to handle stress pulses. A TVS diode according to an embodiment of this invention may be able to handle larger stress pulses owing to the action of the heat sink to allow heat caused by the stress pulses to be dissipated. The first surface of the substrate in such examples may be the active surface (which, in the case of a TVS diode, is the surface closest to the pn junction of the diode). The second surface may be a passive surface of the substrate. As noted above, this orientation of the substrate may enhance the ability of the heat sink to protect the TVS diode against overheating during stress pulses.

It is envisaged that embodiments of this invention can also include devices such as MOS transistors. In such examples, the first surface of the substrate may be the passive surface of the substrate (which in the case of a device including a MOS transistor, is the surface furthest from the channel of the transistor). In devices of this kind, this orientation of the substrate may reduce on-resistance, since the contacts of the transistor may be mounted directly to the carrier, and since no bond wires are required.

It is envisaged that in some embodiments the second surface may have multiple contacts located thereon. For instance, this may allow a device including a MOS transistor of the kind noted above to be implemented.

According to another aspect of the invention, there is provided a method of making a plurality of semiconductor devices of the kind described above. The method includes providing an electrically conductive member having a first surface. The method also includes providing a plurality of semiconductor substrates, each substrate including a first contact located on a first surface of the substrate, and a second contact located on a second surface of the substrate.

The method further includes mounting the first surface of each substrate on the first surface of the electrically conductive member for electrical and thermal conduction between the electrically conductive member and the substrate via the first contact. The method also includes dicing the electrically conductive member to form said plurality of devices. A respective portion of the electrically conductive member in each device forms an electrically conductive heat sink of the device.

In one embodiment, after mounting the first surface of each substrate on the first surface of the electrically conductive member and before dicing the electrically conductive member, the method can include encapsulating the plurality of semiconductor substrates while leaving the second contact of each substrate exposed.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention can provide a semiconductor device. The semiconductor device includes an electrically conductive heat sink that has a first surface. The device can also include a semiconductor substrate that has a first surface and a second surface. The second surface of the substrate is typically a surface of the substrate that is on an opposite side of the substrate to the first surface. A first contact is located on the first surface of the substrate and the second contact is located on the second surface of the substrate. Accordingly, embodiments of this invention may incorporate a semiconductor device having two terminals, such as a semiconductor diode, for example, a pn junction diode or more particularly a transient voltage suppression (TVS) protection device.

The first surface of the substrate is mounted on a first surface of the heat sink. The mounting of the substrate on the first surface of the heat sink can allow for good electrical and thermal conduction between the heat sink and the substrate via the first contact. Accordingly, as described in more detail below, the heat sink can allow heat to be dissipated from the substrate.

In some semiconductor devices, such as in a diode based TVS protection devices, heat caused by surge pulses within the device is concentrated at a pn junction of the device. The pn junction in such a device may be located near to the first surface of the substrate (the first surface is an active surface of the device), whereby the mounting of the substrate on the heat sink at the first surface can enhance the ability of the heat sink to conduct heat away from the critical region of the device.

The heat sink can allow heat generated during a stress pulse to be dissipated to a carrier upon which the device may be mounted and/or to the surrounding atmosphere.

In some embodiments the heat sink, which is electrically conductive, can also act as an electrical connection to the substrate via the first contact. The dual role of the heat sink for conducting both heat and current can allow a relatively compact device to be implemented.

The second surface of the substrate can be mountable on a surface of a carrier. The carrier may, for instance, be a printed circuit board (PCB). This can allow the second contact that is provided on the second surface of the substrate to be electrically connected to a corresponding contact that is located on the surface of the carrier. As described in more detail below, the electrically conductive heat sink may also be electrically connectable to a corresponding contact on the surface of the carrier. In other examples, the electrically conductive heat sink can allow contacts to be completed to other features of the device such as one or more other semiconductor substrates (e.g. for forming a bidirectional device as described in relation to FIG. 7).

Figure 2:
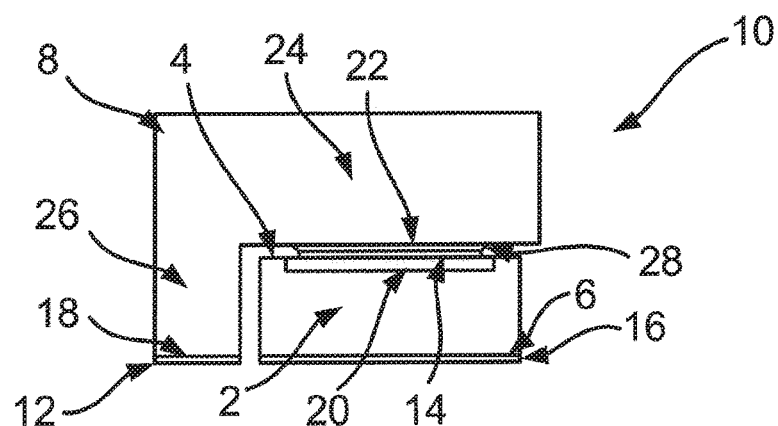
FIG. 2 shows a semiconductor device in accordance with an embodiment of the invention.

FIG. 2 shows a semiconductor device according to an embodiment of this invention. The device 10 includes an electrically conductive heat sink 8. The electrically conductive heat sink 8 may be metallic. For instance, the electrically conductive heat sink 8 may comprise a metal such as copper. As will be described in more detail below, in some embodiments the heat sink 8 may be provided with an outer coating.

The device 10 also includes a semiconductor substrate 2 which may, for example, be a silicon substrate. The semiconductor substrate 2 includes a first surface 4 and a second surface 6. In this embodiment, the substrate 2 includes a semiconductor region 20 located adjacent the first surface 4. The semiconductor region 20 can form a pn junction at an interface between the semiconductor region 20 and the underlying substrate. Accordingly, in this embodiment, the device may comprise a pn junction diode for implementing a diode such as a TVS diode.

In this example, the pn junction at an interface between the semiconductor region 20 and the underlying substrate forms an active region of the device. This active region is closer to the first surface 4 of the substrate than it is to the second surface 6 of the substrate. Accordingly, in this example, the first surface 4 is an active surface of the device 10, while the second surface 6 is a passive surface of the device.

In this embodiment, a first contact 14 is provided on the first surface 4 of the substrate 2. The first contact 14 can provide a connection to a first side of the pn junction. The device 10 can also include a second contact 16 that is located on the second surface 6 of the substrate 2. The second contact 16 can provide a connection to a second side of the pn junction. Accordingly, in this embodiment, the device 10 is a two terminal device.

The electrically conductive heat sink 8 includes a first surface 22. The first surface 4 of the substrate is mounted on the first surface 22 of the heat sink for electrical and thermal conduction between the heat sink 8 and the substrate 2 via the first contact 14. Since, in this example, the first surface 4 is an active surface of the device 10, the orientation of the substrate 2 may enhance the ability of the heat sink 8 to disperse heat away from the region of the device (typically the pn junction) that is most susceptible to overheating. It is envisaged that in other examples first surface may be a passive surface of the substrate 2. This alternative orientation of the substrate 2 may allow the active surface of the substrate to be mounted directly on the surface of the carrier (e.g. to reduce on-resistance).

The first surface 22 may be planar. The first surface 22 may be located on a first portion 24 of the heat sink 8 that extends substantially parallel to a plane containing the first surface 4 of the substrate 2 to allow convenient mounting of the substrate 2 on the heat sink 8. Note that the provision of the first surface 22 can allow for a contact region between the heat sink 8 and the first contact 14 to have a relatively large surface area for good electrical and thermal conduction between the substrate 2 and the heat sink 8 via the first contact 14. As shown in FIG. 2, the connection between the first contact 14 and the first surface 22 of the heat sink 8 can include a substance 28 such as solder or an electrically conductive glue.

In this embodiment, the heat sink 8 also includes a second portion 26. The second portion 26 extends away from the first portion 24 for mounting the electrically conductive heat sink 8 on the surface 31 of the carrier. In some embodiments, the second portion 26 of the heat sink 8 can extend in a direction substantially orthogonal to the plane of the first surface 4 of the substrate 2. For instance, as shown in FIG. 2, the second portion 26 extends down from the first portion 24 past an edge of the substrate 22 for mounting on the surface 31 of the carrier 30. The mounting of the heat sink 8 on the surface 31 of the carrier 30 can be implemented at an end of the second portion 26 distal the first portion 24. The mounting may be a mechanical mounting. In this embodiment however, in this example, the second portion 26 includes an electrical contact 18 to allow the electrically conductive heat sink 8 to form an electrical connection to the carrier 30. For instance, an electrical contact 12 can be provided at a surface 18 of the second portion 26 located at an end of the second portion 26 distal the first portion 24. In the example of FIG. 2, the surface 18 of the second portion 26 is substantially coplanar the second surface 6 of the substrate 2, such that the contact 12 is substantially coplanar the second contact 16 of the substrate 2. This arrangement can allow for convenient mounting of the device 10 on a carrier 30 having a substantially planar surface.

Figure 3:
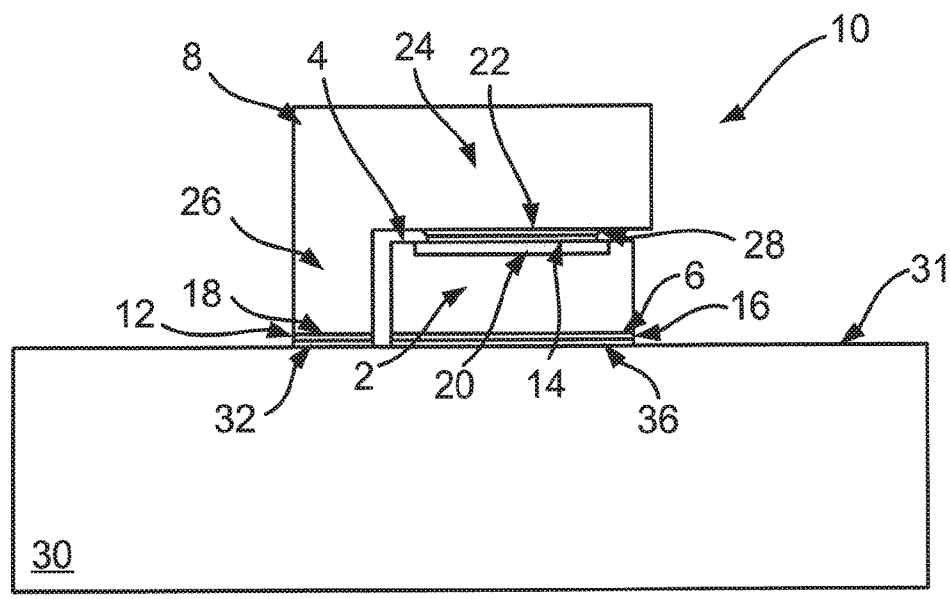
FIG. 3 shows the semiconductor device of FIG. 2 mounted on a carrier such as a printed circuit board (PCB) in accordance with an embodiment of the invention.

FIG. 3 shows the device 10 of FIG. 2 mounted on a surface 31 of a carrier 30. Note that when the device 10 is mounted on the carrier 30, the first surface 22 of the heat sink 8 faces downward toward the surface 31 of the carrier 30. Although not essential, this arrangement can allow for convenient placement of the substrate 2 between the first surface 22 and the surface 31, particularly where the first surface 22 and the surface 31 are substantially parallel. As mentioned above, the surface 31 of the carrier 30 is, in this example substantially planar. As shown in FIG. 3, the connection between the second contact 16 of the substrate 2 and the surface 31 of the carrier 30 may include a substance 36 such as solder or an electrically conductive glue. Similarly, the connection between the contact 12 of the second portion 26 of the heat sink 8 and surface 31 of the carrier 30 may include a substance 32 such as solder or an electrically conductive glue.

From FIGS. 2 and 3, it may be appreciated that the device 10 in accordance with an embodiment of this invention can form a compact construction in which the heat sink can provide an electrical connection between the first contact 14 of the substrate 2 and the surface 31 of the carrier.

Figure 4:
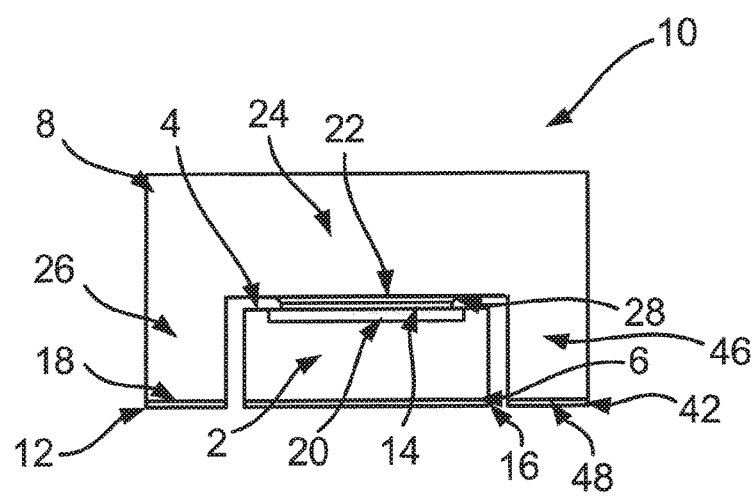
FIG. 4 shows a semiconductor device in accordance with another embodiment of the invention.

FIG. 4 shows a semiconductor device 10 in accordance with another embodiment of this invention. In this embodiment, the thermally conductive heat sing 8 includes a further portion 46 that may be similar in construction to the second portion 26 described above in relation to FIGS. 2 and 3. The further portion 46 extends away from the first portion 24 for mounting the electrically conductive heat sink 8 on the surface of a carrier. The mounting may be a simple mechanical mounting and/or may allow a further electrical connection to be made between the heat sink 8 and a corresponding contact on the surface of the carrier. In the present example, the connection formed by the further portion 46 includes an electrical contact 42 located on a surface 48 of the further portion 46 that is at an end of the further portion 46 distal the first portion 24. The configuration of the further portion 46 in this example is therefore similar to that of the second portion 26 of the heat sink 8, although the further portion 46 is provided at a different location within the device 10. In the example of FIG. 4, the second portion 26 and the further portion 46 each extend down either side or edge of the substrate 2 in a direction away from the first portion 24.

The provision of the further portion 46 in FIG. 4 can improve the robustness of the mechanical and/or electrical connection of the heat sink 8 to the surface of a carrier. Note that the provision of two contacts (either of the contacts 12 and 48) in the embodiment of FIG. 4 can lower the contact resistance of the device. Also, since the heat sink 8 is mounted in multiple locations, the ability of the heat sink 8 to dissipate heat generated within the device 10 (for instance, during a stress pulse) away from the device 10 into a carrier upon which the device 10 may be mounted.

It is envisaged that more than two portions such as the second portion 26 and the further portion 46 described above in relation to FIG. 4 may be provided.

Figure 5:
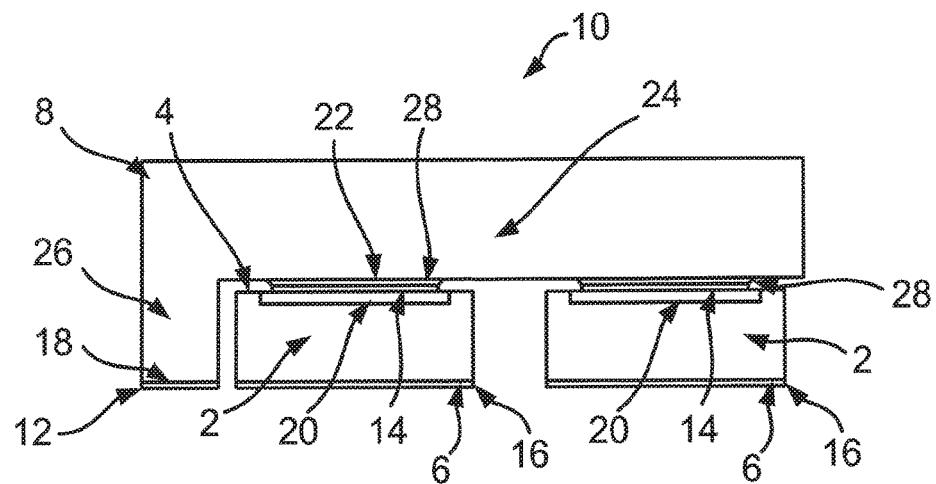
FIG. 5 shows a semiconductor device in accordance with a further embodiment of the invention.

FIG. 5 shows a semiconductor device in accordance with a further embodiment of this invention. The device 10 in this embodiment is similar to the device described above in relation to FIGS. 2 and 3. However, in this example, the device 10 includes two semiconductor substrates 2. Both substrates 2 may be similar in configuration to the semiconductor substrates described above. Both semiconductor substrates 2 may thus have a first surface 4 that is mounted to a first surface 22 of the heat sink 8. It is envisaged that more than two substrates 2 may be provided in this manner. The first surface 22 may be suitably dimensioned in order to receive each substrate 2. The device in FIG. 5 can allow the pn junction diodes formed within each substrate 2 to be connected in parallel, increasing the capacity of the device 10.

In common with the embodiments described above, the device 10 in the example of FIG. 5 includes a second portion 26 that forms an electrical connection to the surface of a carrier at a contact 12 provided on a surface 18 located at an end of the second portion 26 distal the first portion 24. The second surfaces 6 of the substrates 2 may each be coplanar the surface 18 of the second portion 26, to allow for convenient mounting of the device 10 on a carrier having a planar surface. It is envisaged that, as described above in relation to FIG. 4, embodiments including multiple substrates may also include one or more further portions of the kind 46 shown in FIG. 4.

Figure 6:
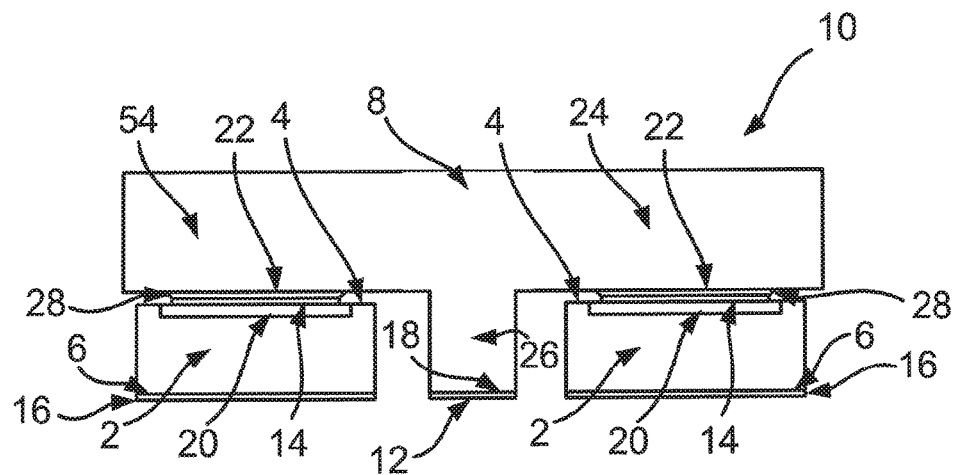
FIG. 6 shows a semiconductor device in accordance with another embodiment of the invention.

FIG. 6 shows a semiconductor device 10 in accordance with another embodiment of this invention. The embodiment in FIG. 6 has a configuration that is similar to that described in relation to FIG. 5, except that the second portion 26 of the heat sink 8 is located in between the substrates 2, whereas in the example of FIG. 5, the second portion 26 of the heat sink 8 extends down past an edge one of the substrates 2. Because the second portion 26 in FIG. 6 is located equidistant the two substrates 2, electrical and thermal conduction between the two substrates 2 and the second portion 26 of the heat sink 8 may be more balanced than in the example of FIG. 5, in which one of the substrates 2 is further away from the second portion 26 than the other.

Figure 7:
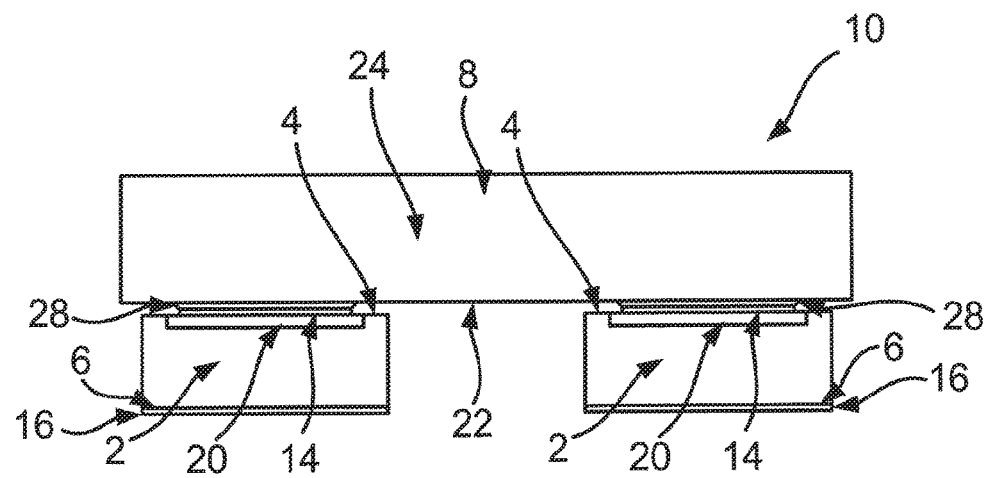
FIG. 7 shows a semiconductor device in accordance with a further embodiment of the invention.

FIG. 7 shows a semiconductor device 10 in accordance with a further embodiment of this invention. In this embodiment, the device 10 includes two semiconductor substrates 2 that may both be configured similarly to those described above. Both semiconductor substrates 2 may be mounted on a first surface 22 of a first portion 24 of the heat sink 8. In this embodiment, the heat sink 8 does not necessarily include a second portion 26 of the kind described above. Where such a second portion is provided, the second portion may provide for mechanical mounting of the device 10 on the surface of the carrier, but would not include an electrical contact for forming an electrical connection.

In the embodiment of FIG. 7, the device 10 is a bidirectional device including two pn junction diodes, one diode being located in each of the two semiconductor substrates 2. The first diode may be connected to the surface of a carrier at the contact 16 of one of the substrates 2 and the second diode may be connected to the surface of the carrier at the contact 16 of the other substrate 2. In this embodiment, the two diodes formed within the separate substrates 2 are connected together by the electrically conductive heat sink 8. In particular, the electrical contacts 14 on the first surfaces 4 of each substrate 2 are electrically connected to the first surface 22 of the electrically conductive heat sink 8. As noted above, the electrical connection between each first contact 14 and the surface 22 may include a substance such as solder or an electrically conductive glue.

In the embodiment of FIG. 7, the heat sink 8 can again perform a dual function: (i) to electrically interconnect the two diodes in the separate substrates 2 via their respective contacts 14, and (ii) to act as a heat sink for draining heat away from the substrates 2, for instance, during a stress pulse within the device 10.

It is envisaged that in a device according to an embodiment of this invention in which two or more substrates are provided (for instance, see FIGS. 5 to 7 and 10B), where some or all of those substrates have an active surface and a passive surface, those substrates may all be mounted with a common orientation (i.e. all of the substrates may be oriented such that their active surface is mounted on the first surface of the heat sink or such that their passive surface is mounted on the first surface of the heat sink). It is also envisaged that in some embodiments, the substrates may be mounted in a mixture of orientations (i.e. some may be oriented such that their active surface is mounted on the first surface of the heat sink and some may be oriented such that their passive surface is mounted on the first surface of the heat sink). The orientation of the substrates may, for instance, be chosen according to the device type that they implement (e.g. diode, MOS transistor . . . ).

Figure 8:
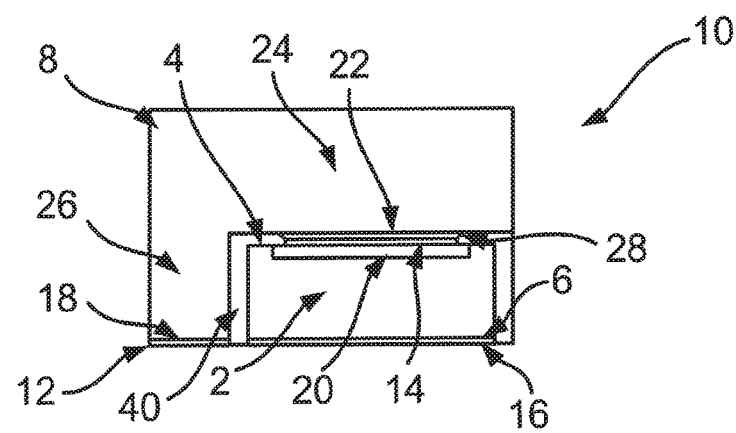
FIG. 8 shows a semiconductor device in accordance with another embodiment of the invention.

FIG. 8 shows a semiconductor device 10 in accordance with a further embodiment of this invention. The device 10 in this embodiment is similar to that described above in relation to FIG. 2. However, in this embodiment an encapsulant 40 is provided. The encapsulant covers the (or, where multiple substrates are provided, each) substrate 2 while leaving the second contact 16 of the (or each) substrate 2 exposed. The encapsulant 40 can thus provide mechanical protection for the substrate 2. For instance the encapsulant 40 can protect the edges of the substrate 2 from mechanical damage. In some embodiments, the encapsulant 40 can also cover parts of the surface 22 that do not form a connection with the (or each) substrate 2. In the embodiment of FIG. 8, the encapsulant 40 is located in a region defined by the first surface 22 and an edge of the second portion 26 of the heat sink 8. Any suitable encapsulant of the kind known in the art may be used.

Figure 9:
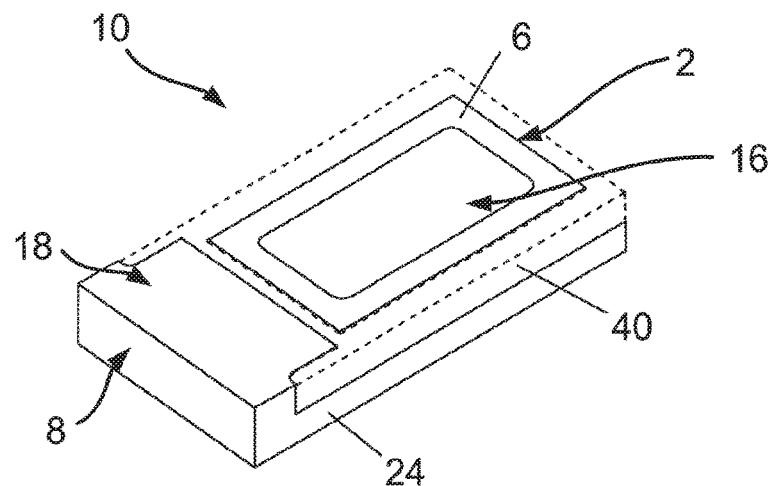
FIG. 9 shows a semiconductor device in accordance with a further embodiment of the invention.

FIG. 9 shows another view of a semiconductor device 10 in accordance with an embodiment of this invention. The embodiment in FIG. 9 is similar to that described above in relation to FIG. 8. FIG. 9 shows the configuration of the encapsulant 40 to surround the substrate 2 while leaving the contact 16 of the substrate 2 exposed for electrical connection to the surface of a carrier. Note that FIG. 9 also illustrates that the encapsulant 40 leaves the surface 18 of the second portion 26 of the heat sink 8 exposed for connection in a similar manner.

Figure 10A:
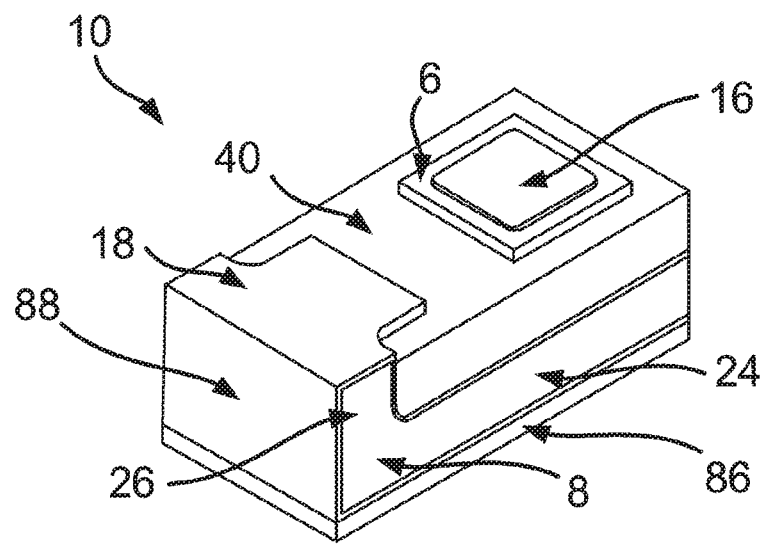
FIG. 10A shows a semiconductor device in accordance with another embodiment of the invention.
Figure 10B:
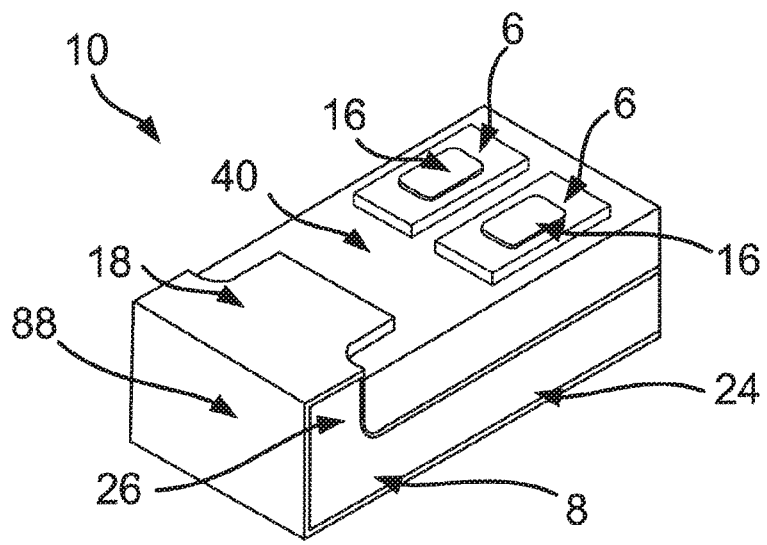
FIG. 10B shows a semiconductor device in accordance with a further embodiment of the invention.

FIGS. 10A and 10B show semiconductor devices 10 in accordance with further embodiments of this invention. The embodiments in FIG. 10A and FIG. 10B are similar to those described above in relation to FIG. 9, although the differences will be noted below.

In FIG. 10A it can be seen that the substrate of the device 10 is dimensioned differently to that shown in FIG. 9. The heat sink 8 may receive substrates of various dimensions in accordance with design requirements.

The device 10 may in some embodiments include a protective portion 86. The protective portion 86 may comprise a layer of material, which may be located on a surface of the heat sink 8. For instance, as shown in FIG. 10A, the protective portion 86 may be provided on an outer surface of the heat sink opposite the first surface of the heat sink 8. This may provide mechanical and electrical protection for an upper surface of the device 10 when the device 10 is mounted on a carrier. The protective portion 86 may comprise a plastics material. In some embodiments, the protective portion 86 comprises the same material as that used to the form the encapsulant 40. A protective portion of this kind may also be included in any of the other embodiments described herein.

In FIG. 10B, two semiconductor substrates are provided. Unlike the embodiment in FIG. 5, the substrates 2 in the embodiment of FIG. 10B are located side by side at a common distance away from the second portion 26 of the heat sink 88. The embodiments of FIGS. 10A and 10B illustrate that the first surface 22 of the heat sink 8 may be dimensioned to receive any suitable number of substrates in accordance with design requirements.

The embodiments of FIGS. 10A and 10B also show that the heat sink 8 may be provided with an electrically conductive layer 88 on its outer surface. For instance, the electrically conductive layer 88 may comprise a substance such as NiPdAu. This layer can act as a wetting layer to improve the solderability of the surface of the heat sink.

Figure 1:
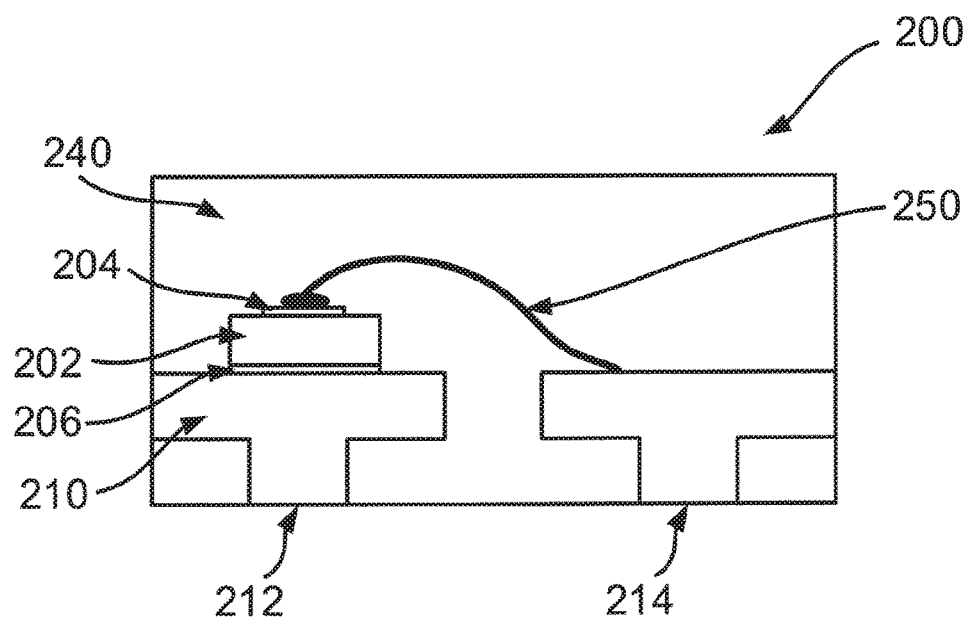
FIG. 1 shows an example of a semiconductor device including a Quad Flat No-leads (QFN) package.
Figure 11:
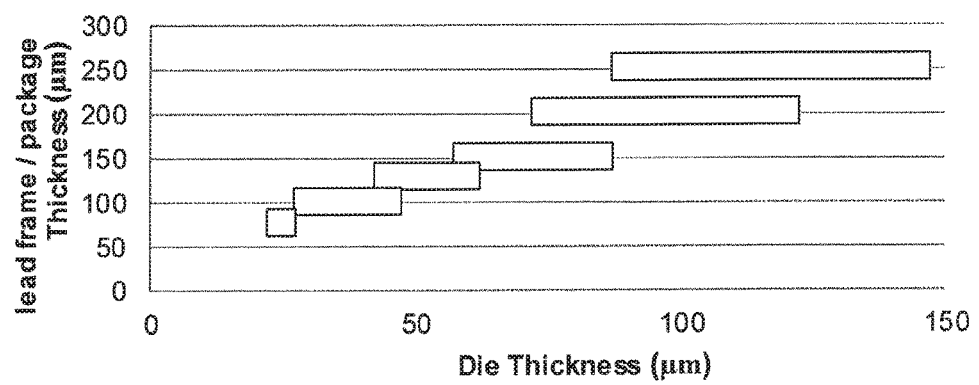
FIG. 11 shows a graph relating to package thicknesses that can be implemented according to an embodiment of the invention.

FIG. 11 shows a graph relating to package thicknesses that can be implemented according to embodiments of this invention. The thickness of a package (along a direction substantially parallel to the surface normal of the semiconductor substrate(s) provided in the package) is limited by the thickness of the first portion 24 of the heat sink 8, by the thickness of the semiconductor substrate 2 itself and by any connections that are provided between the substrate(s) 2 and the heat sink 8. As mentioned previously, devices according to embodiments of this invention need not incorporate bond wires, allowing them to achieve lower package thicknesses than devices of the kind shown in FIG. 1. As can be seen from FIG. 11, embodiments of this invention can be used to form packages having a thickness as small as 0.075 mm (for a semiconductor substrate thickness of 0.03 mm)

Figure 12A:
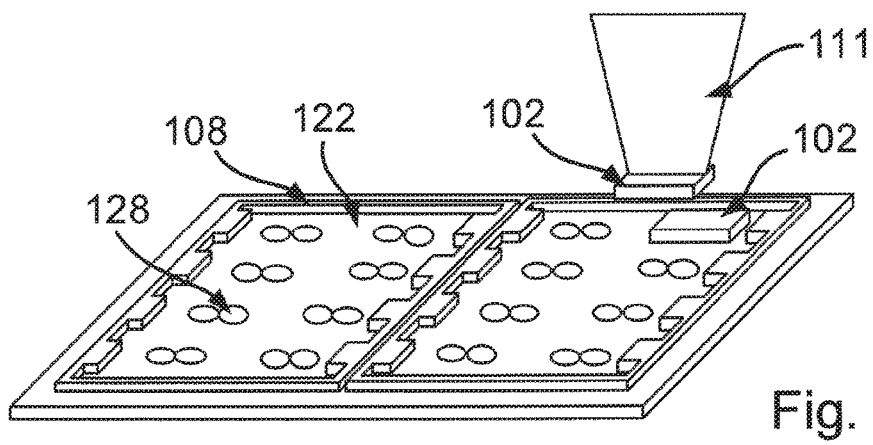
FIGS. 12A to 12C show a method of making a semiconductor device in accordance with an embodiment of the invention.
Figure 12B:
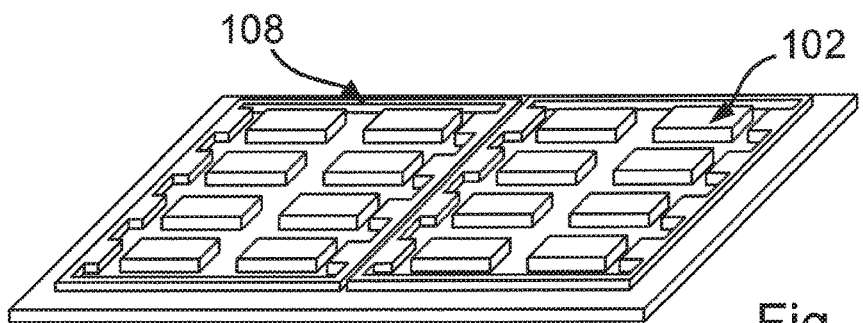
Figure 12C:
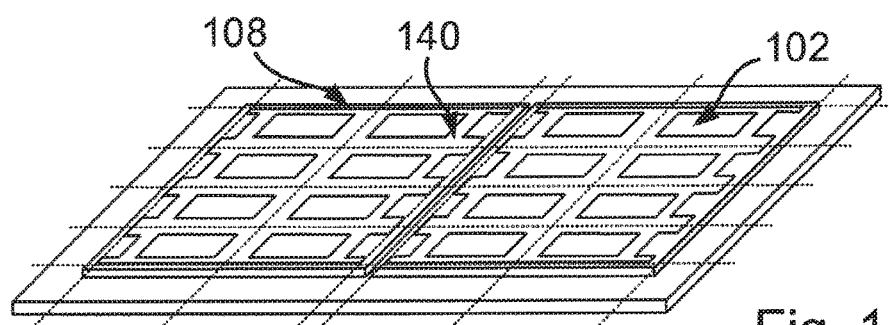

FIGS. 12A-12C show an example method of making a semiconductor device. In this embodiment, the method can allow a plurality of devices to be made.

In a first step, shown in FIG. 12A, the method involves providing an electrically conductive member 108 having a first surface 122. The electrically conductive member will subsequently be divided into a plurality of portions as explained below, each portion of which will form an electrically conductive heat sink of the kind described above in relation to the earlier embodiments.

The electrically conductive member 108 can be suitably dimensioned and provided with features for forming the various parts of the heat sinks (e.g. the first and second portions 24, 26 as well as any further portions) after dicing. The method can also include providing a substance 128 at locations on the surface 122 of the electrically conductive member 108 at which substrates 102 are to be placed. The substance 128 may, as noted above, comprise a solder or an electrically conductive glue. The substrates 102 may be placed at regular intervals onto the surface 122 at locations corresponding to the positions of the substance 128 using a picker 111 as shown in FIG. 12A, to reach the arrangement shown in FIG. 12B.

The method can include providing a plurality of such semiconductor substrates 102, where each semiconductor substrate is of the kind described above in relation to the earlier embodiments.

Once the substrates 102 have been mounted onto the electrically conductive member 108 such that a first surface of each substrate is mounted on the surface 122, an encapsulant 140 can be used to fill the space around the substrates 102 resulting in the arrangement shown in FIG. 12C. Note that the encapsulant 140 leaves the second contact of each substrate 102 exposed as noted above. Thereafter, the electrically conductive member 108 can be diced as indicated by the dotted lines in FIG. 12C. Each individual die produced by this dicing step can form a semiconductor device of the kind described above.

Embodiments of this invention can be used to implement a transient voltage suppression (TVS) diode. Transient voltage suppression diodes may typically need to handle large currents in order to drain unwanted current to ground or another rail during a stress pulse. Accordingly, embodiments of this invention are suited to the implementation of TVS diodes, since the electrically conductive heat sink can effectively dissipate heat generated by the stress pulse within the device, thereby allowing the TVS diode to handle larger currents during a stress pulse without overheating.

Although embodiments of this invention have been described in relation to a device including a pn junction diode (for instance for implementing a TVS diode), it is envisaged that the arrangement of the heat sink with one or more semiconductor substrates mounted thereon may also be used to implement other devices, e.g. MOS transistors.

Accordingly, there has been described a semiconductor device and a method of making the same. The device includes an electrically conductive heat sink having a first surface. The device also includes a semiconductor substrate. The device further includes a first contact located on a first surface of the substrate. The device also includes a second contact located on a second surface of the substrate. The first surface of the substrate is mounted on the first surface of the heat sink for electrical and thermal conduction between the heat sink and the substrate via the first contact. The second surface of the substrate is mountable on a surface of a carrier.

Although particular embodiments of the invention have been described, it will be appreciated that many modifications/additions and/or substitutions may be made within the scope of the claimed invention.

The invention claimed is:

1. A semiconductor device comprising: an electrically conductive heat sink having a first surface; a semiconductor substrate having a first surface, a second surface, and two opposite sides; a first contact located on the first surface of the substrate; and a second contact located on the second surface of the substrate, wherein the first surface of the substrate is mounted on the first surface of the heat sink for electrical and thermal conduction between the heat sink and the substrate via the first contact, wherein the second surface of the substrate is mountable on a surface of a carrier via the second contact, wherein the electrically conductive heat sink further comprises a first portion extending substantially parallel to a plane containing the first surface of the substrate, wherein the first portion comprises the first surface of the electrically conductive heat sink, and a plurality of further portions extending away from the first portion, each further portion extending down and adjacent to the two opposite sides of the substrate to enclose the two opposite sides of the substrate between the plurality of further portions for mounting the electrically conductive heat sink on the surface of the carrier, wherein each further portion comprises a mounting surface that is coplanar with the second surface of the substrate and a further contact surface that is coplanar with the second contact, wherein the mounting surface of each further portion is mountable on the surface of the carrier via the further contact, and wherein the electrically conductive heat sink comprises an electrically conductive outer layer on an outer surface of the electrically conductive heat sink.

2. The semiconductor device of claim 1, wherein the second surface of the substrate and the electrically conductive heat sink are both mountable on the surface of the carrier.

3. The semiconductor device of claim 2, wherein the electrically conductive heat sink comprises at least one contact for electrically connecting the heat sink to the surface of the carrier.

4. The semiconductor device of claim 1, further comprising a plurality of further semiconductor substrates, each further substrate comprising:
a first contact located on a first surface of the further substrate, and
a second contact located on a second surface of the further substrate,
wherein the first surface of each further substrate is mounted on the first surface of the heat sink for electrical and thermal conduction between the heat sink and the further substrate via the first contact, and wherein the second surface of each further substrate is mountable on the surface of the carrier.

5. The semiconductor device of claim 1 further comprising a second semiconductor substrate comprising:
a first contact located on a first surface of the second substrate, and
a second contact located on a second surface of the second substrate,
wherein the first surface of the second substrate is mounted on the first surface of the heat sink for electrical and thermal conduction between the heat sink and the second substrate via the first contact,
wherein the second surface of the second substrate is mountable on the surface of the carrier, and
wherein the heat sink electrically interconnects the first contact of each substrate, for current flow between the substrates.

6. The semiconductor device of claim 1, wherein the electrically conductive outer layer comprises NiPdAu.

7. The semiconductor device of claim 1, further comprising an encapsulant that covers the substrate while leaving the second contact of the substrate exposed.

8. The semiconductor device of claim 1, further comprising one of solder and an electrically conductive glue attaching the first contact of the substrate to the first surface of the heat sink.

9. The semiconductor device of claim 1, wherein the semiconductor device is mounted on the surface of the carrier.

10. The semiconductor device of claim 1, wherein the semiconductor device is a transient voltage suppression (TVS) diode.

11. The semiconductor device of claim 5, further comprising an encapsulant that covers the substrate while leaving the second contact of the substrate exposed.

12. The semiconductor device of claim 5, further comprising one of solder and an electrically conductive glue attaching the first contact of the substrate to the first surface of the heat sink.

13. The semiconductor device of claim 1, wherein each of the mounting surfaces comprises a further contact on the mounting surface of the substrate that is substantially coplanar with the second contact located on the second surface of the substrate.

14. The semiconductor device of claim 1, further comprising a protective layer provided on an outer surface of the heat sink that is opposite the first surface of the heat sink.

15. The semiconductor device of claim 1, wherein the surface opposite the first surface of the heat sink is coated by the electrically conductive outer layer.

* * * * *